(12) United States Patent
Bao et al.

(10) Patent No.: US 10,553,700 B2
(45) Date of Patent: Feb. 4, 2020

(54) GATE CUT IN RMG

(71) Applicant: INTERNATIONAL BUSINESS MACHINES CORPORATION, Armonk, NY (US)

(72) Inventors: Ruqiang Bao, Niskayuna, NY (US); Siva Kanakasabapathy, Pleasanton, CA (US); Andrew M. Greene, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/991,128

(22) Filed: May 29, 2018

(65) Prior Publication Data

US 2019/0371912 A1 Dec. 5, 2019

(51) Int. Cl.

| | |
|---|---|
| *H01L 21/8234* | (2006.01) |
| *H01L 27/088* | (2006.01) |
| *H01L 29/78* | (2006.01) |
| *H01L 21/335* | (2006.01) |
| *H01L 29/66* | (2006.01) |
| *H01L 21/762* | (2006.01) |
| *H01L 21/308* | (2006.01) |
| *H01L 21/306* | (2006.01) |

(Continued)

(52) U.S. Cl.
CPC .... *H01L 29/66545* (2013.01); *H01L 21/0276* (2013.01); *H01L 21/3081* (2013.01); *H01L 21/30604* (2013.01); *H01L 21/76224* (2013.01); *H01L 21/76843* (2013.01); *H01L 21/76885* (2013.01); *H01L 21/823431* (2013.01); *H01L 21/823821* (2013.01); *H01L 21/823842* (2013.01); *H01L 27/0886* (2013.01); *H01L 29/66795* (2013.01); *H01L 29/785* (2013.01)

(58) Field of Classification Search
CPC ..... H01L 21/823431; H01L 21/823437; H01L 21/82345; H01L 21/823821; H01L 21/823828; H01L 21/823842; H01L 27/0886; H01L 27/0924
See application file for complete search history.

(56) References Cited

U.S. PATENT DOCUMENTS

| | | |
|---|---|---|
| 9,263,442 B2 | 2/2016 | Anderson et al. |
| 9,373,641 B2 | 6/2016 | Anderson et al. |

(Continued)

OTHER PUBLICATIONS

Anonymous, "Self-Aligned gate Isolation Process for FINFET CMOS beyond 10nm," ip.com, an IP.com Prior Art Database Technical Disclosure. IP.com No. IPCOM00245702D. Mar. 31, 2016. pp. 1-7.

*Primary Examiner* — Robert G Bachner
*Assistant Examiner* — Molly K Reida
(74) *Attorney, Agent, or Firm* — Tutunjian & Bitetto, P.C.; Vazken Alexanian

(57) ABSTRACT

A method is presented for performing a gate cut in a field effect transistor (FET) structure. The method includes forming a plurality of fins and at least one insulating pillar over a semiconductor substrate, depositing a first work function metal layer, removing the first work function metal layer from a first set of fins, depositing a second work function metal layer, depositing a conductive material over the second work function metal layer, forming at least one gate trench through the conductive material and adjacent the first set of fins to separate active gate regions, and filling the at least one gate trench with an insulating material.

12 Claims, 10 Drawing Sheets

(51) Int. Cl.
*H01L 21/768* (2006.01)
*H01L 21/027* (2006.01)
*H01L 21/8238* (2006.01)

(56) References Cited

U.S. PATENT DOCUMENTS

| | | |
|---|---|---|
| 9,419,015 B1 | 8/2016 | Wu et al. |
| 9,601,335 B2 | 3/2017 | Greene et al. |
| 9,812,365 B1 | 11/2017 | Zhang et al. |
| 9,818,836 B1 | 11/2017 | Sung et al. |
| 9,911,736 B1 * | 3/2018 | Zang .................. H01L 27/0886 |
| 2014/0315371 A1 | 10/2014 | Cai et al. |
| 2015/0340461 A1 | 11/2015 | Wei et al. |
| 2016/0056181 A1 * | 2/2016 | Anderson ........... H01L 27/1211 |
| | | 257/347 |
| 2016/0351563 A1 * | 12/2016 | Chen ................ H01L 21/31111 |
| 2017/0084463 A1 | 3/2017 | Greene et al. |
| 2017/0148682 A1 | 5/2017 | Basker et al. |
| 2018/0350955 A1 * | 12/2018 | Chen ................ H01L 29/66795 |

\* cited by examiner

GATE CUT IN RMG

BACKGROUND

Technical Field

The present invention relates generally to semiconductor devices, and more specifically, to methods for performing gate cuts in field effect transistor (FET) device structures during replacement metal gate (RMG) processes.

Description of the Related Art

Modern integrated circuits are made up of millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling). With increased scaling, new processing sequences and methods may be needed to avoid shorting of adjacent electrical devices.

SUMMARY

In accordance with an embodiment, a method is provided for performing a gate cut in a field effect transistor (FET) structure. The method includes forming a plurality of fins and at least one pillar over a semiconductor substrate, depositing a first work function metal layer, removing the first work function metal layer from a first set of fins, depositing a second work function metal layer, depositing a conductive material over the second work function metal layer, forming at least one gate trench through the conductive material and adjacent the first set of fins to separate active gate regions, and filling the at least one gate trench with an insulating material.

In accordance with another embodiment, a method is provided for performing a gate cut in a field effect transistor (FET) structure. The method includes forming a plurality of fins and at least one pillar over a semiconductor substrate, depositing a first work function metal layer, removing the first work function metal layer from a first set of fins, depositing a second work function metal layer, depositing an organic patterning layer over the second work function metal layer, forming at least one gate trench through the organic patterning layer, filling the at least one gate trench with an insulating material, forming a conductive adhesion liner over the insulating material and the second work function metal layer, and depositing a conductive material over the conductive adhesion liner.

In accordance with yet another embodiment, a method is presented for performing a single gate cut after dual work function metal patterning. The method includes forming a plurality of fins over a semiconductor substrate, depositing a first work function metal layer, removing the first work function metal layer from a first set of fins, depositing a second work function metal layer, depositing a conductive material over the second work function metal layer, forming at least one gate trench through the conductive material and through the second work function metal layer, and filling the at least one gate trench with an insulating material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
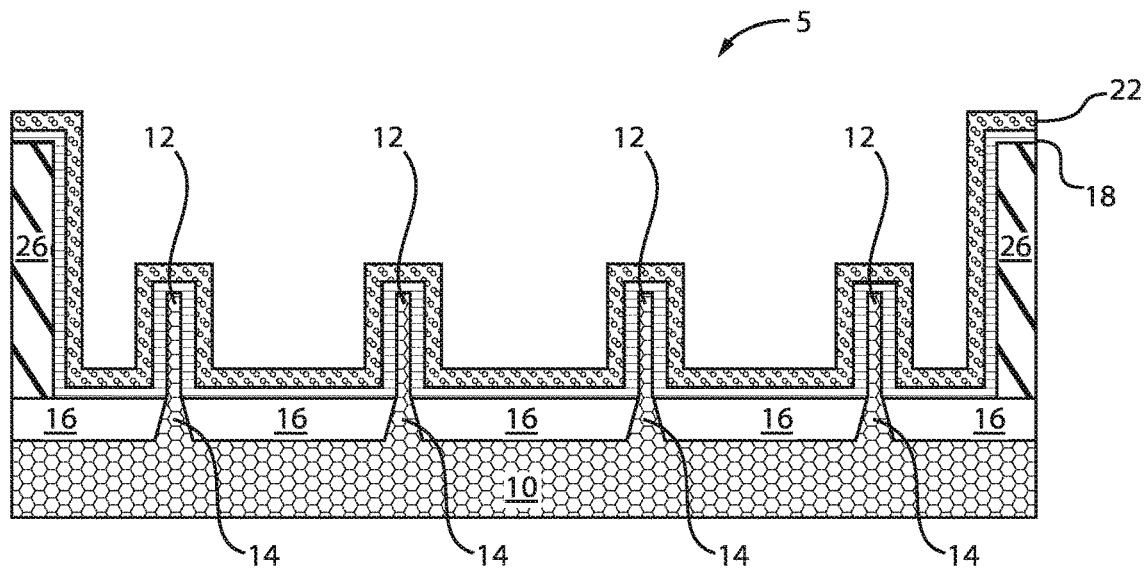
FIG. 1 is a cross-sectional view of a semiconductor structure including a first work function metal layer deposited over the fins, where the gate cut pillar has already been formed prior to RMG, in accordance with an embodiment of the present invention.

Embodiments in accordance with the present invention provide methods and devices for performing gate cuts for device area reduction and performance improvement. A gate cut (CT) etch is an etch process that removes a portion of a gate structure that extends from a first active region of the device to a second active region of the device. More specifically, in some process flows a gate structure, e.g., a sacrificial gate structure can be patterned and etched, in which a single gate structure extends from being present on the channel region of fin structures in a first active region to being present on the channel region of the fin structures of a second active region. The gate cut (CT) etch removes the portion of the gate structure that is present between the first active region and the second active region of the device, in which isolation between the active regions of the device is desired. Removing the portion of the gate structure separating the first active region from the second active region defines two separate gate structures, e.g., a first gate structure present on a first active region and a second gate structure present on a second active region that are separated by a gate cut trench. The formation of the gate cut trench usually defines the tip to tip dimension separating the adjacent gate structures.

Embodiments in accordance with the present invention provide methods and devices for performing gate cuts in field effect transistor (FET) device structures during replacement metal gate (RMG) processes. The gate cuts can be performed by cutting the thin work function metal (WFM) layers in RMG by employing either WFM liner or bulk etching, or employing WFM patterning to remove the thicker WFM stack prior to cutting the thin WFM. In some exemplary embodiments of the present invention, a gate cut occurs both in the in the dummy gate silicon prior to the RMG module and in the RMG module. In the alternative, a single gate cut can occur only in the RMG where the thinner WFM is etched after the thicker WFM patterning. As a result, gate cuts occur at least in the RMG or RMG module.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a first work function metal layer deposited over the fins, where the gate cut pillar is already formed, in accordance with an embodiment of the present invention.

In various exemplary embodiments, a semiconductor structure 5 includes a plurality of fins 12 formed over a substrate 10. The fins 12 can define tapered bottom portions 14. Shallow trench isolation (STI) regions 16 can be formed adjacent the tapered bottom portions 14. Moreover, pillars 26 can be formed over a portion of the STI regions 16. Pillars are insulator "gate cut in dummy gate silicon" pillars which were formed by etching the dummy silicon in a prior module and filling with insulator. The dummy gates were patterned and etched in the prior module to avoid having to cut the thick WFM in RMG. Only the thin WFM gate regions in RMG are cut in these exemplary embodiments. The pillars 26 can also be referred to as insulating CT pillars or simply insulating pillars.

The fins 12 can be formed between the insulating pillars 26. A high-k dielectric layer or liner 18 can be formed over the fins 12 and over the insulating pillars 26. A first work function metal layer 22 can be formed directly over the high-k oxide layer 18. The insulating pillars 26 can be created in a process prior to replacement metal gate (RMG). In this embodiment, the gate cut is formed in the "thick work function metal (WFM) region" in the process steps prior to forming the RMG.

In the embodiment illustrated with respect to FIGS. 1-6, the CT is cut twice. CT is a patterning cut mask and CT can apply to both cut of dummy gate and cut of metal gate. The CT cut can also be referred to as a gate cut or CT gate cut. In particular, a first CT cut is performed in the dummy gate silicon before RMG and a second CT cut is performed in RMG after WFM patterning and bulk metal fill and CMP.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe.

As used herein, a "semiconductor fin" refers to a semiconductor structure including a portion having a shape of a rectangular parallelepiped. The direction along which a semiconductor fin 12 laterally extends the most is herein referred to as a "lengthwise direction" of the semiconductor fin 12. The height of each semiconductor fin 12 can be in a range from 5 nm to 300 nm, although lesser and greater heights can also be employed. The width of each semiconductor fin 12 can be in a range from 5 nm to 100 nm, although lesser and greater widths can also be employed.

The high-k dielectric 18 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one example embodiment, the first work function metal layer 22 can include silicon valence band edge metals such as, but not limited to, Pt, Rh, Jr, Ru, Cu, Os, Be, Co, Pd, Te, Cr, Ni, TiN, and alloys thereof. For example, the first work function metal layer 22 can be a layer of TiN.

In another example embodiment, the first work function metal layer 22 can include silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the first work function metal layer 22 can be a layer of TiAl.

The first work function metal layer 22 can be formed, for example, by physical vapor deposition (PVD), chemical vapor deposition (CVD), or atomic layer deposition (ALD).

The thickness of the first work function metal layer 22 can be set at a value from 2 nm to 30 nm, and usually, from 3 nm to 10 nm, although lesser and greater thicknesses can also be employed.

Figure 2:
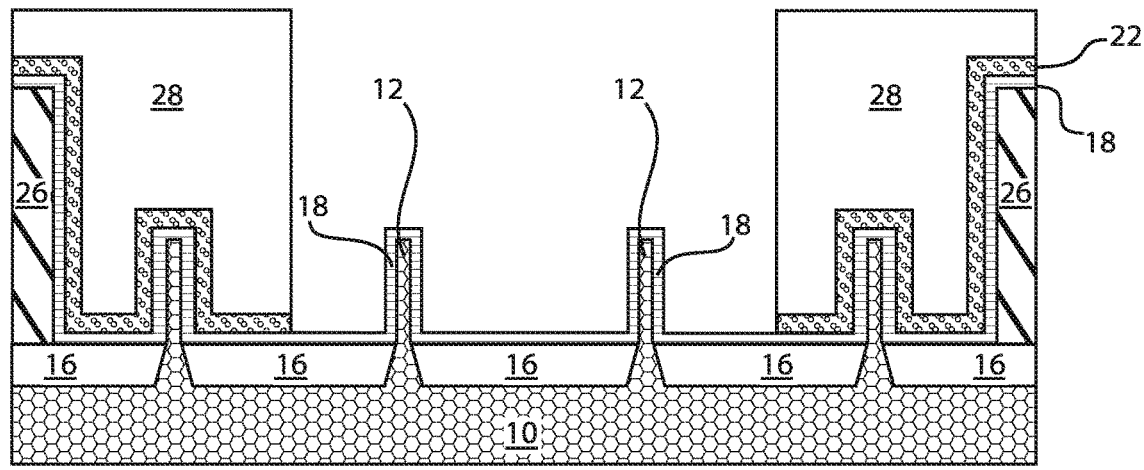
FIG. 2 is a cross-sectional view of the semiconductor structure of FIG. 1 where an organic patterning layer is deposited and patterned to allow removal of the first work function metal layer from a portion of the fins, in accordance with an embodiment of the present invention.

FIG. 2 is a cross-sectional view of the semiconductor structure of FIG. 1 where an organic patterning layer is deposited and patterned for removal of the first work function metal layer from a portion of the fins, in accordance with an embodiment of the present invention.

In various exemplary embodiments, an organic patterning layer 28 is deposited over a portion of the structure 5. A patterning stack of ARC (anti-reflective coating) and photoresist is deposited and exposed using a block mask. The mask pattern is then etched into the OPL to expose regions where the WFM will be etched. In particular, the organic patterning layer 28 is formed over the insulating pillars 26 and over a portion of the fins 12. Centrally located fins 12 are not covered by the organic patterning layer 28. After the organic patterning layer 28 is deposited and patterned, exposed portions or sections of the first work function metal layer 22 are removed to expose the high-k dielectric layer 18 of the exposed fins 12. The organic patterning layer 28 can be used for lithography and/or pattern transfer and/or etch sequences.

Figure 3:
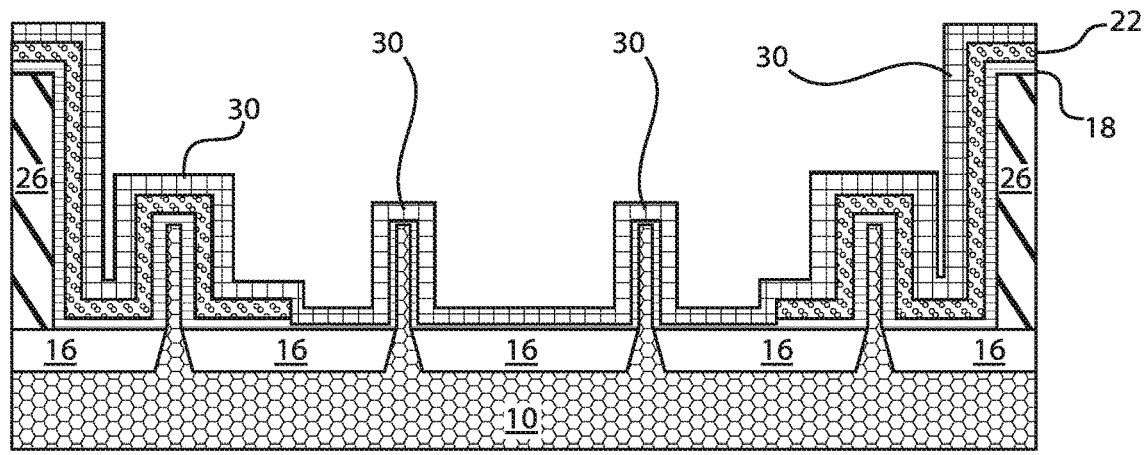
FIG. 3 is a cross-sectional view of the semiconductor structure of FIG. 2 where a second work function metal layer is deposited, in accordance with an embodiment of the present invention.

FIG. 3 is a cross-sectional view of the semiconductor structure of FIG. 2 where the OPL is etched away and a second work function metal layer is deposited, in accordance with an embodiment of the present invention.

In various exemplary embodiments, a second work function metal layer 30 is deposited.

In one example embodiment, the second work function metal layer 30 can include silicon valence band edge metals such as, but not limited to, Pt, Rh, Jr, Ru, Cu, Os, Be, Co, Pd, Te, Cr, Ni, TiN, and alloys thereof. For example, the second work function metal layer 30 can be a layer of TiN.

In another example embodiment, the second work function metal layer 30 can include silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second work function metal layer 30 can be a layer of TiAl.

The second work function metal layer 30 can be formed, for example, by physical vapor deposition (PVD), chemical vapor deposition (CVD), or atomic layer deposition (ALD).

The thickness of the second work function metal layer 30 can be set at a value from 2 nm to 30 nm, and usually, from 3 nm to 10 nm, although lesser and greater thicknesses can also be employed.

Figure 4:
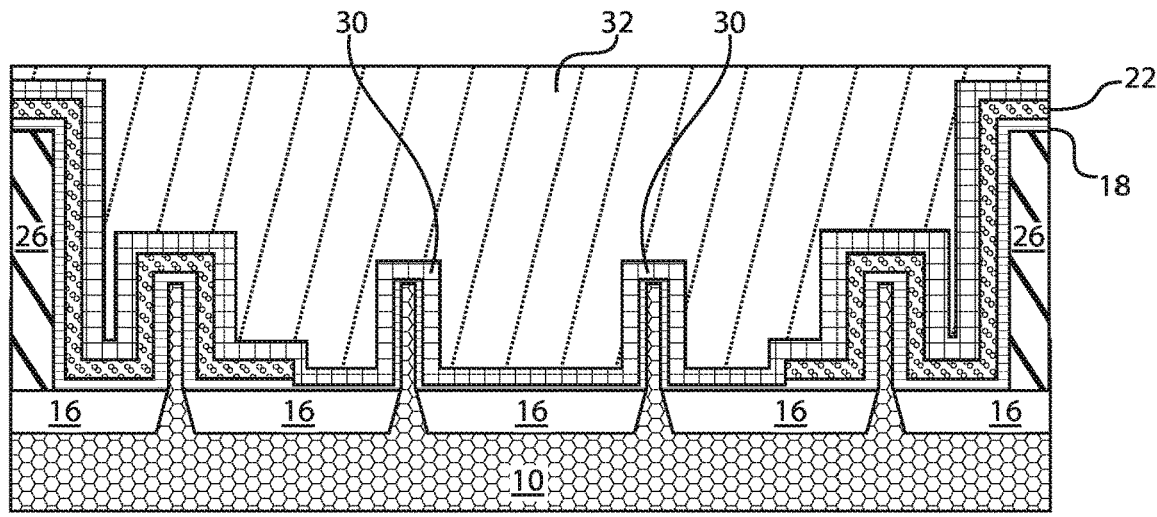
FIG. 4 is a cross-sectional view of the semiconductor structure of FIG. 3 where a metal fill takes place, in accordance with an embodiment of the present invention.

FIG. 4 is a cross-sectional view of the semiconductor structure of FIG. 3 where a metal fill takes place, in accordance with an embodiment of the present invention.

In various exemplary embodiments, a metal fill 32 takes place. The metal fill 32 can be referred to as a conducting material. The metal fill 32 can be any suitable conducting material, including but not limited to, e.g., tungsten (W), cobalt (Co), copper (Cu), nickel (Ni), titanium (Ti), tantalum (Ta), ruthenium (Ru), or any suitable combination of those materials.

Figure 5:
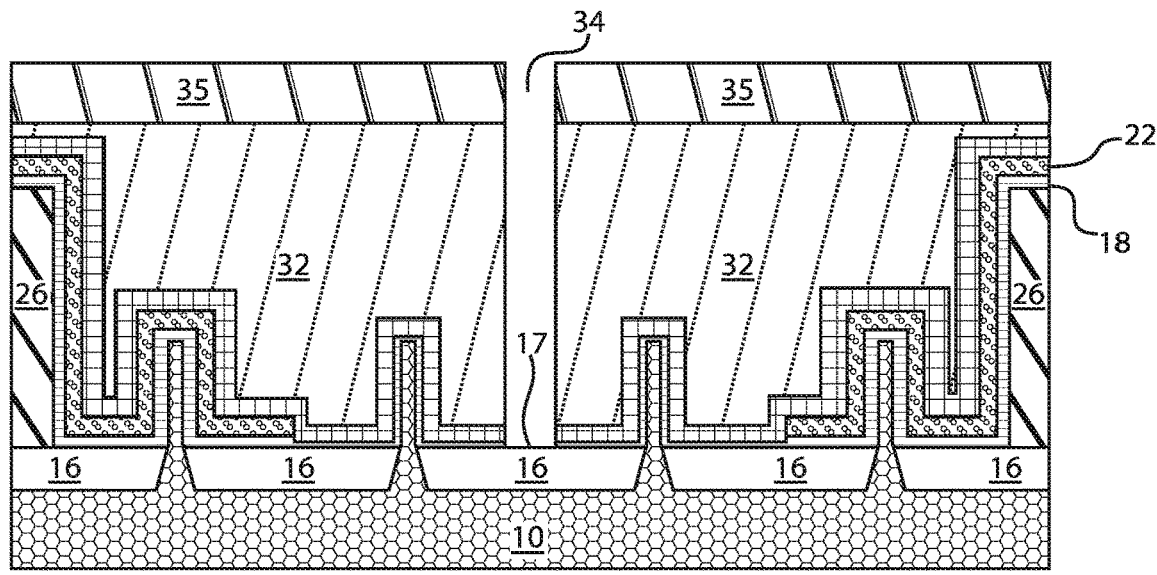
FIG. 5 is a cross-sectional view of the semiconductor structure of FIG. 4 where a patterning stack is deposited, a gate cut takes place, and the region with the thinner WFM is etched, in accordance with an embodiment of the present invention.

FIG. 5 is a cross-sectional view of the semiconductor structure of FIG. 4 where a patterning stack is deposited and a gate cut takes place and the region with the thinner WFM is etched, in accordance with an embodiment of the present invention.

In various exemplary embodiments, a patterning stack 35 is deposited over the metal fill 32. A gate cut is then performed. The gate cut results in the formation of a gate trench 34. The gate trench 34 extends to a top surface 17 of the STI region 16. The gate is cut and the etch is performed in the region with the thinner WFM. The thicker WFM region was cut in prior modules before RMG.

The patterning stack 35 can be formed by any suitable methods. Non-limiting examples of suitable methods for forming the patterning stack 35 include physical vapor deposition (PVD), chemical vapor deposition (CVD), plasma-enhanced chemical vapor deposition (PECVD), atomic layer deposition (ALD), or any combination thereof.

The patterning stack 35 can be, e.g., an organic patterning layer (OPL) or an anti-reflective coating (ARC) layer. This is the gate cut pattern that is transferred into the metal to form the gate cut. Thus, the OPL layer and the ARC layer can be used as a lithographic stack to pattern the underlying layers. The OPL layer can be formed at a predetermined thickness to provide reflectivity and topography control during etching of the layers below. The OPL layer includes an organic material, such as a polymer. The thickness of the OPL layer can be in a range from about 50 nm to about 300 nm. The ARC layer which minimizes the light reflection during lithography can include silicon, for example, a silicon anti-reflective layer (SiARC). The thickness of the ARC layer can be in range from about 10 nm to about 100 nm. The ARC layer can be an antireflective layer for suppressing unintended light reflection during photolithography. Exemplary materials for an antireflective layer include metal silicon nitrides, or a polymer film. The anti-reflective layer can be formed, depending on materials, for example, using sputter deposition, chemical vapor deposition, or spin coating.

This gate cut is a second gate cut, as a first gate cut occurred in the dummy gate silicon prior to RMG module. This second gate cut is a gate cut in the replacement metal gate (RMG).

As a general reference, gates are disposed over fins 12. The gates can be formed over the fins 12 patterned from a substrate. Epitaxial contacts (not shown) forming source and drain regions on opposing sides of the gates are positioned over the fins 12. Narrow metal contacts are formed on the top of the metal gates. In some aspects, another metal layer can then be formed over the narrow metal contacts in order to electrically connect the adjacent gates to form the gate interconnect. However, shorting can occur in regions between gate stacks and/or fins.

As such, a trench can be etched and formed last, e.g., following formation of the gate stacks. That is, the dummy gate can be cut or etched during replacement metal gate (RMG) formation. In some embodiments, this "CT cut last" process provides for maximization of scaling potential for gate tip-to-tip separation in static random access memory (SRAM).

CT in RMG allows for (i) scaling gate tip-to-tip separation, (ii) resolving gate tip-to-tip shorting due to residual WFM shorts observed in conventional methods, (iii) a capacitance benefit for performance by scaling gate extension past fin, and (iv) ensuring there is complete WFM coverage of the end fin without pinch-off to ensure effective electrostatic control.

The methods and structures disclosed herein can use a dummy gate "cut last" method to define active gate regions post spacer/EPI module. This process can be demonstrated in polysilicon dummy gate prior to RMG or replacement metal gate (RMG) modules. This process improves gate "tip-to-tip" dimension or the gate cut width (distance between cut gate lines) window for scaling.

Figure 6:
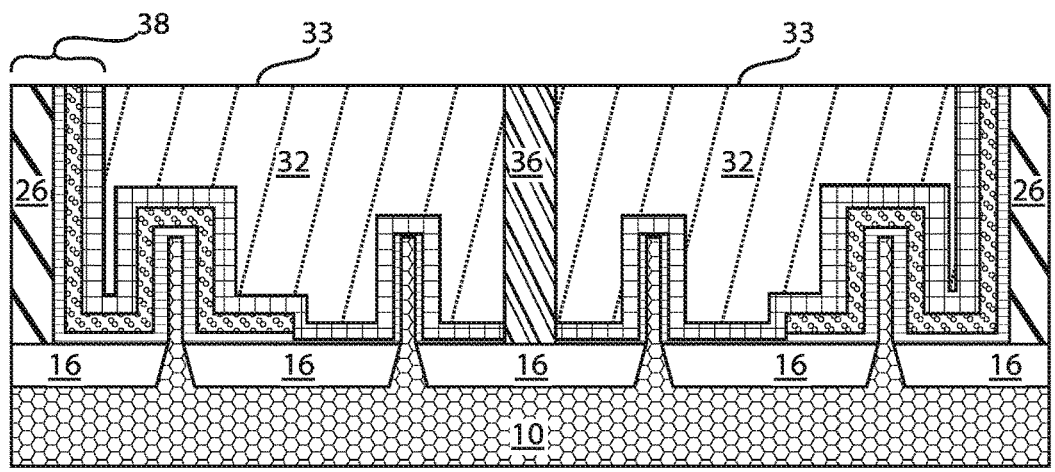
FIG. 6 is a cross-sectional view of the semiconductor structure of FIG. 5 where the gate trench is filled with a dielectric material, in accordance with an embodiment of the present invention.

FIG. 6 is a cross-sectional view of the semiconductor structure of FIG. 5 where the gate trench is filled with a dielectric material, in accordance with an embodiment of the present invention.

In various exemplary embodiments, the patterning stack 35 is removed and the metal fill 32 is planarized such that top surfaces 38 of the first work function metal layer 22 and the second work function metal layer 30 are exposed. Additionally, an insulating material 36 is deposited within the gate trench 34. The insulating material 36 can be planarized, by, e.g., chemical mechanical planarization (CMP) such that the insulating material 36 is flush with the top surface 33 of the planarized metal fill 32.

The insulating material 36 can be, e.g., a nitride-based material. In one example, the insulating material can be silicon nitride (SiN). The insulating material 36 can be deposited by any suitable method depending on the type of material and can be, for example, plasma-enhanced chemical vapor deposition (PECVD) or atomic layer deposition (ALD).

Therefore, with respect to FIGS. 1-6, a direct anisotropic tungsten (W) etch and a WFM etch on thin WFM side at post gate WCMP takes place (where the insulating material 36 is formed). The thicker WFM metal stack side was cut in the dummy gate silicon (left and right sides of the structure where the insulating CT pillars 26 are formed from etching the dummy polysilicon gate in modules prior to RMG).

Figure 7:
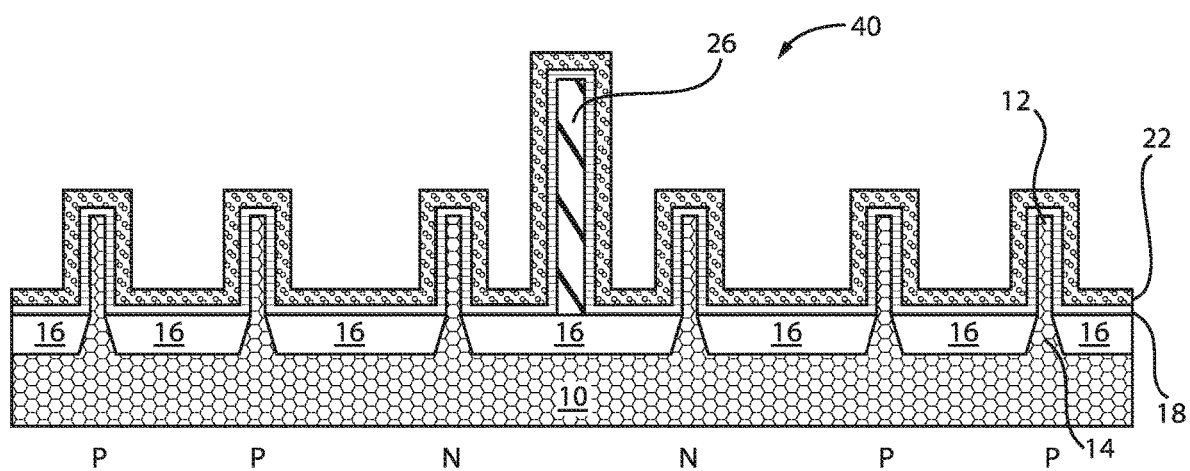
FIG. 7 is a cross-sectional view of a semiconductor structure where a first work function metal layer is deposited over the structure depicting a single central gate cut fill pillar which was already formed prior to RMG, in accordance with another embodiment of the present invention.

FIG. 7 is a cross-sectional view of a semiconductor structure where a first work function metal layer is deposited over the structure depicting a single central gate cut fill pillar which was already formed prior to RMG, in accordance with another embodiment of the present invention.

In various exemplary embodiments, a semiconductor structure 40 includes a plurality of fins 12 formed over a substrate 10. The fins 12 can define tapered bottom portions 14. Shallow trench isolation (STI) regions 16 can be formed adjacent the tapered bottom portions 14. Moreover, a single insulating pillar 26 can be formed over a central STI region 16. The fins 12 can be formed on opposed ends of the single insulating pillar 26. A high-k dielectric layer 18 can be formed over the fins 12 and over the insulating pillar 26. A first work function metal layer 22 can be formed directly over the high-k oxide layer 18. The insulating pillars 26 were cut in the prior module using anisotropic polysilicon etch and dielectric fill.

In the embodiment illustrated with respect to FIGS. 7-12, the CT is cut twice. In particular, a first CT cut is performed in the dummy gate silicon before RMG and a second CT cut is performed in RMG after WFM patterning and bulk metal fill and CMP for a shared gate only and n/p boundaries next to each of the devices (isolated gate). The gate is cut and the etch is performed in the region with the thinner WFM. The thicker WFM region was cut in prior modules before RMG.

Figure 8:
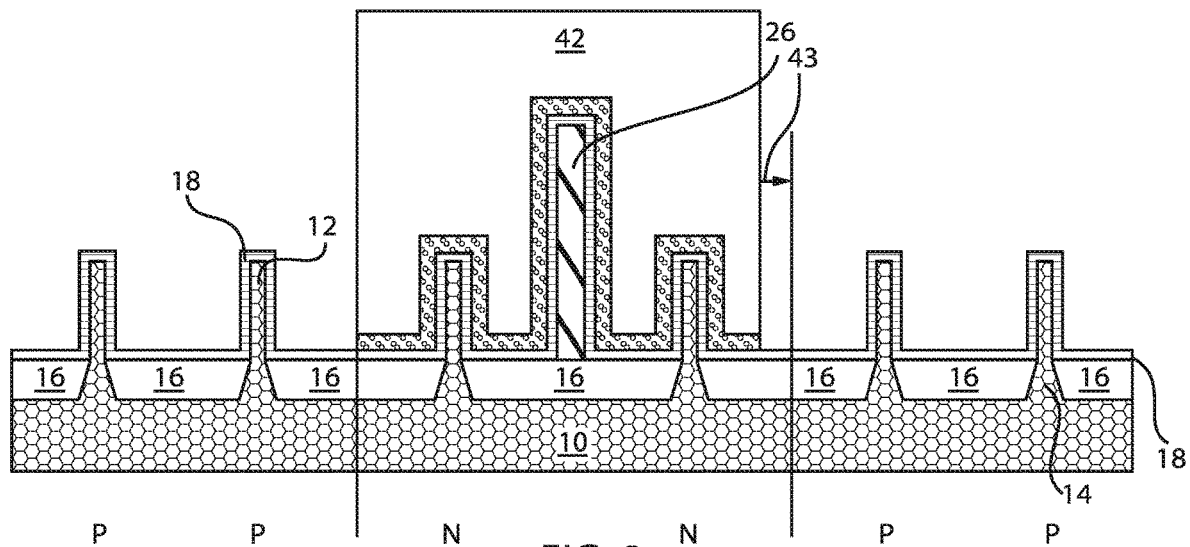
FIG. 8 is a cross-sectional view of the semiconductor structure of FIG. 7 where an organic patterning layer is deposited and patterned to allow removal of the first work function metal layer from a portion of the fins, in accordance with an embodiment of the present invention.

FIG. 8 is a cross-sectional view of the semiconductor structure of FIG. 7 where an organic patterning layer is deposited and patterned for removal of the first work function metal layer from a portion of the fins, in accordance with an embodiment of the present invention.

In various exemplary embodiments, an organic patterning layer 42 is deposited over a portion of the structure 40. In particular, the organic patterning layer 42 is formed over the pillar 26 and over a portion of the fins 12 adjacent the pillar 26. After the organic patterning layer 42 is deposited, the exposed portions or sections of the first work function metal layer 22 are removed to expose the high-k dielectric layer 18 of the exposed fins 12. Element 43 illustrates the bias needed for the CT cut.

Figure 9:
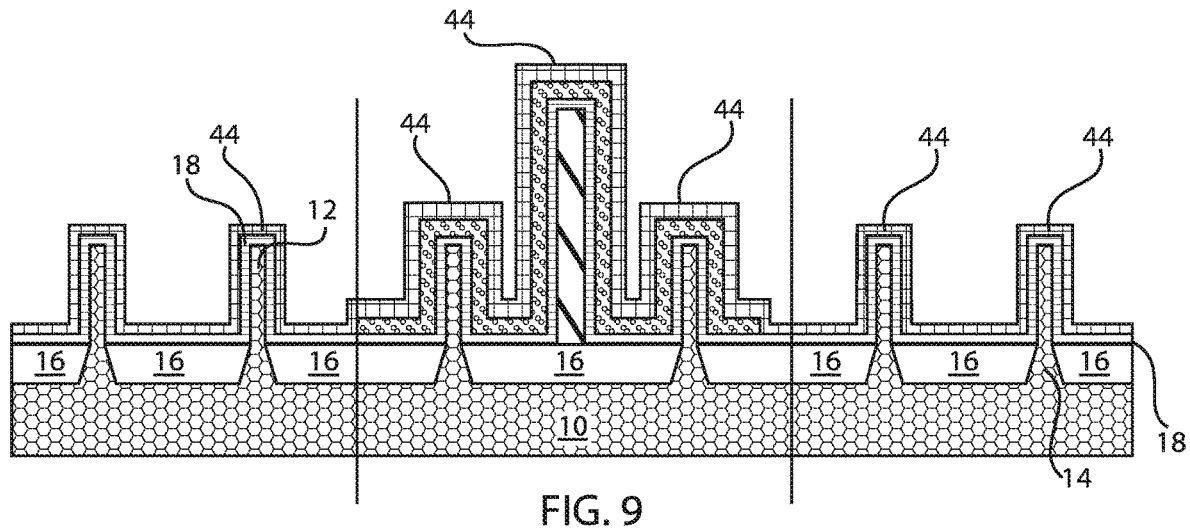
FIG. 9 is a cross-sectional view of the semiconductor structure of FIG. 8 where a second work function metal layer is deposited, in accordance with an embodiment of the present invention.

FIG. 9 is a cross-sectional view of the semiconductor structure of FIG. 8 where a second work function metal layer is deposited, in accordance with an embodiment of the present invention.

In various exemplary embodiments, a second work function metal layer 44 is deposited.

Figure 10:
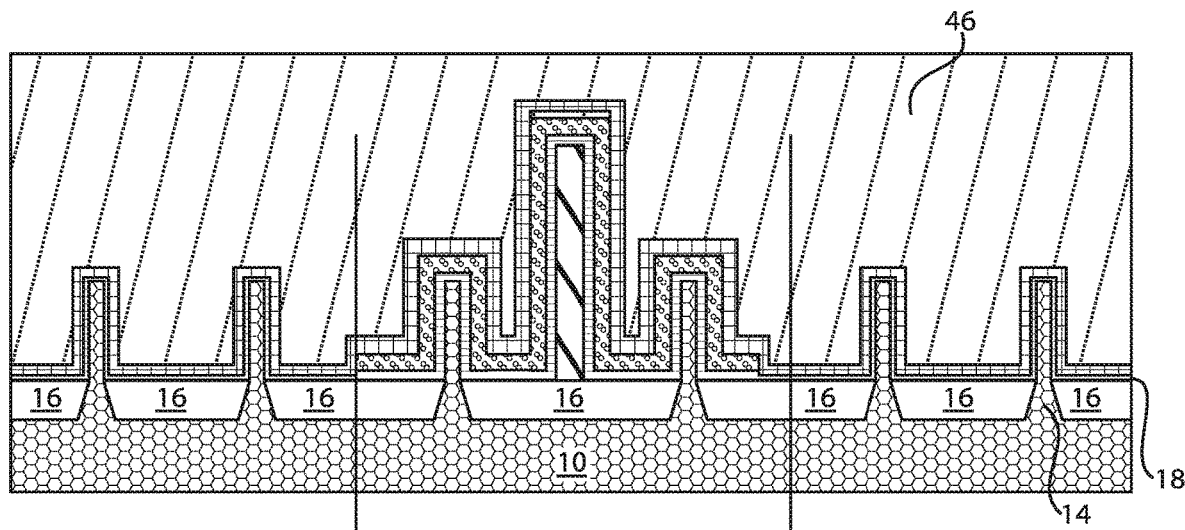
FIG. 10 is a cross-sectional view of the semiconductor structure of FIG. 9 where a metal fill takes place, in accordance with an embodiment of the present invention.

FIG. 10 is a cross-sectional view of the semiconductor structure of FIG. 9 where a metal fill takes place, in accordance with an embodiment of the present invention.

In various exemplary embodiments, a metal fill 46 takes place. The metal fill 46 can be referred to as a conducting material. The metal fill 46 can be any suitable conducting material, including but not limited to, e.g., tungsten (W), cobalt (Co), copper (Cu), nickel (Ni), titanium (Ti), tantalum (Ta), ruthenium (Ru), or any suitable combination of those materials.

Figure 11:
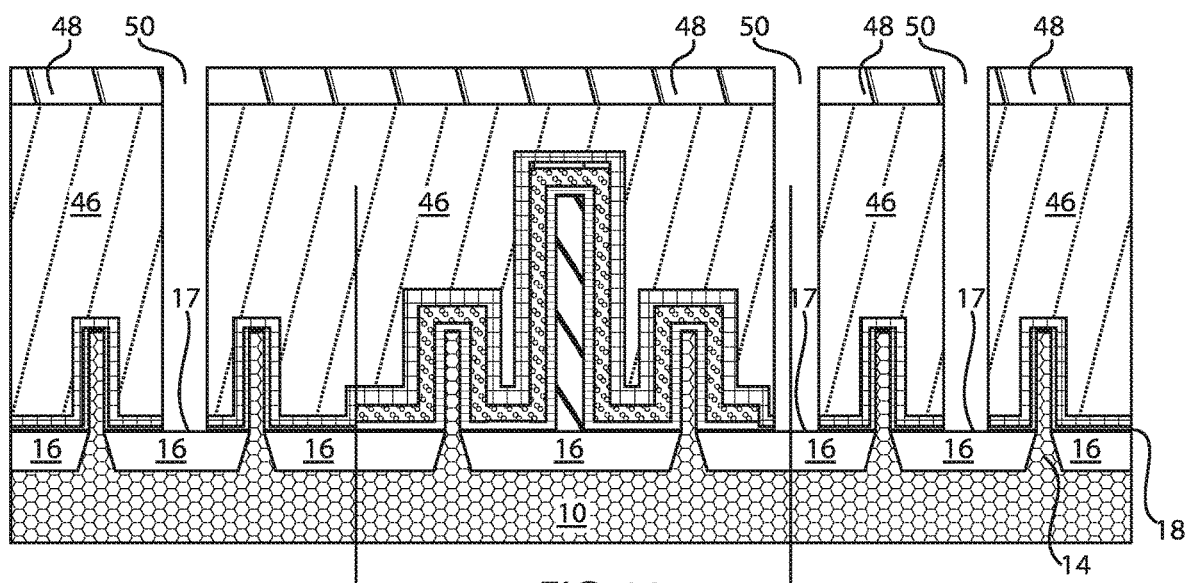
FIG. 11 is a cross-sectional view of the semiconductor structure of FIG. 10 where a patterning stack is deposited and patterned, multiple gate cuts take place, and the region with the thinner WFM is etched, in accordance with an embodiment of the present invention.

FIG. 11 is a cross-sectional view of the semiconductor structure of FIG. 10 where a patterning stack is deposited and patterned, and multiple gate cuts take place and the region with the thinner WFM is etched, in accordance with an embodiment of the present invention.

In various exemplary embodiments, a patterning stack 48 is deposited over the metal fill 46. A gate cut is then performed. The gate cut results in the formation of a plurality of gate trenches 50. The gate trenches 50 extend to a top surface 17 of the STI region 16. The gate is cut and the etch is performed in the region with the thinner WFM. The thicker WFM region was cut in prior modules before RMG.

Figure 12:
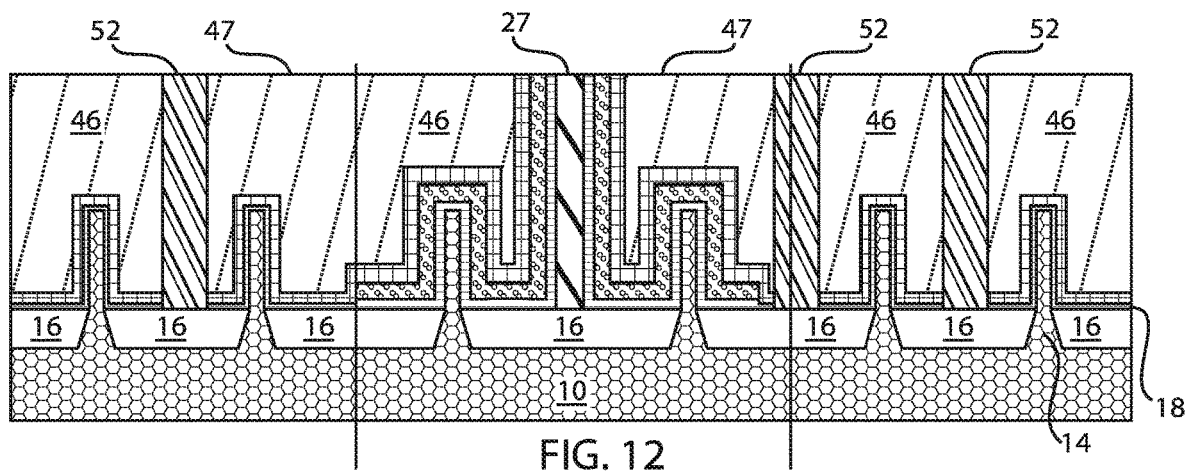
FIG. 12 is a cross-sectional view of the semiconductor structure of FIG. 11 where the gate cuts are filled with a dielectric material, in accordance with an embodiment of the present invention.

FIG. 12 is a cross-sectional view of the semiconductor structure of FIG. 11 where the gate cuts are filled with a dielectric material, in accordance with an embodiment of the present invention.

In various exemplary embodiments, the patterning stack 48 is removed and the metal fill 46 is planarized such that top surfaces of the first work function metal layer 22 and the second work function metal layer 44 are exposed adjacent the pillar 26. Additionally, metal etching takes place, followed by an insulator fill with insulating material 52 into the plurality of trenches 50, then CMP back to the top of the metal. The insulating material 52 can be planarized, by, e.g., CMP such that the insulating material 52 is flush with the top surface 47 of the planarized metal fill 46. Also, the top surface of the insulating material 52 is flush with the top surface 27 of the single insulating pillar 26.

Figure 13:
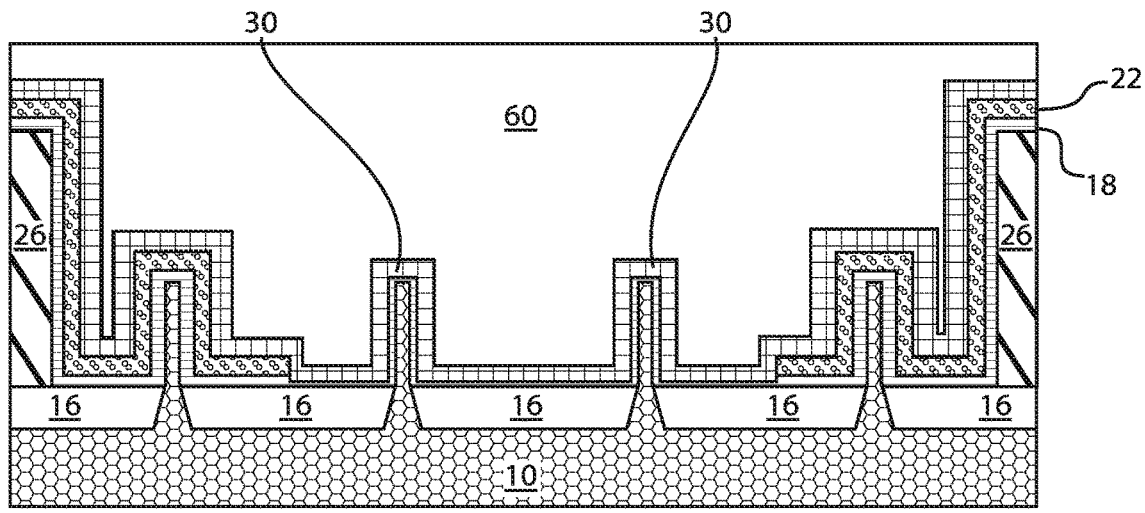
FIG. 13 is a cross-sectional view of a semiconductor structure where an organic patterning layer is deposited over a second work function metal layer after patterning and etching the WFM, in accordance with another embodiment of the present invention.

FIG. 13 is a cross-sectional view of a semiconductor structure where an organic patterning layer is deposited over a second work function metal layer after patterning and etching the WFM, in accordance with another embodiment of the present invention.

In various exemplary embodiments, an organic patterning layer 60 is formed over the second work function metal layer 30. This is a similar incoming structure to the first embodiment (e.g., FIG. 3) after block mask patterning and WFM etching.

In the embodiment illustrated with respect to FIGS. 13-17, the CT is cut twice. In particular, a first CT cut is performed in the dummy gate silicon before RMG and a second CT cut is performed in RMG after WFM patterning and bulk metal fill and CMP for a shared gate only.

Figure 14:
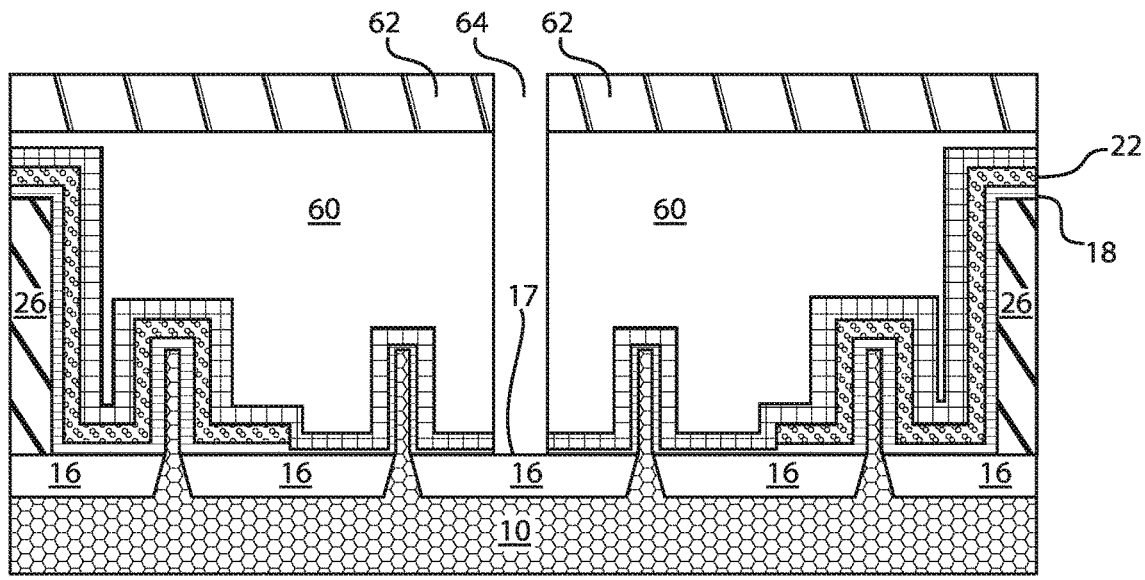
FIG. 14 is a cross-sectional view of the semiconductor structure of FIG. 13 where a patterning stack is deposited and patterned, and a gate cut takes place by etching the region with the thinner WFM, in accordance with an embodiment of the present invention.

FIG. 14 is a cross-sectional view of the semiconductor structure of FIG. 13 where a patterning stack is deposited and patterned, and a gate cut takes place by etching the region with the thinner WFM, in accordance with an embodiment of the present invention.

In various exemplary embodiments, a patterning stack 62 is deposited over the organic patterning layer 60. A gate cut is then performed. The gate cut results in the formation of a gate trench 64. The gate trench 64 extends to a top surface 17 of the STI region 16. An anisotropic OPL etch and WFM etch is performed. This WFM etch can be isotropic (wet) or anisotropic (dry). The WFM undercut needs to be minimized to maintain the desired gate cut dimension (tip-to-tip). Also, a patterning stack of ARC (anti-reflective coating) and photoresist is deposited and exposed using a block mask. The mask pattern is then etched into the OPL to expose regions where the WFM will be etched.

Figure 15:
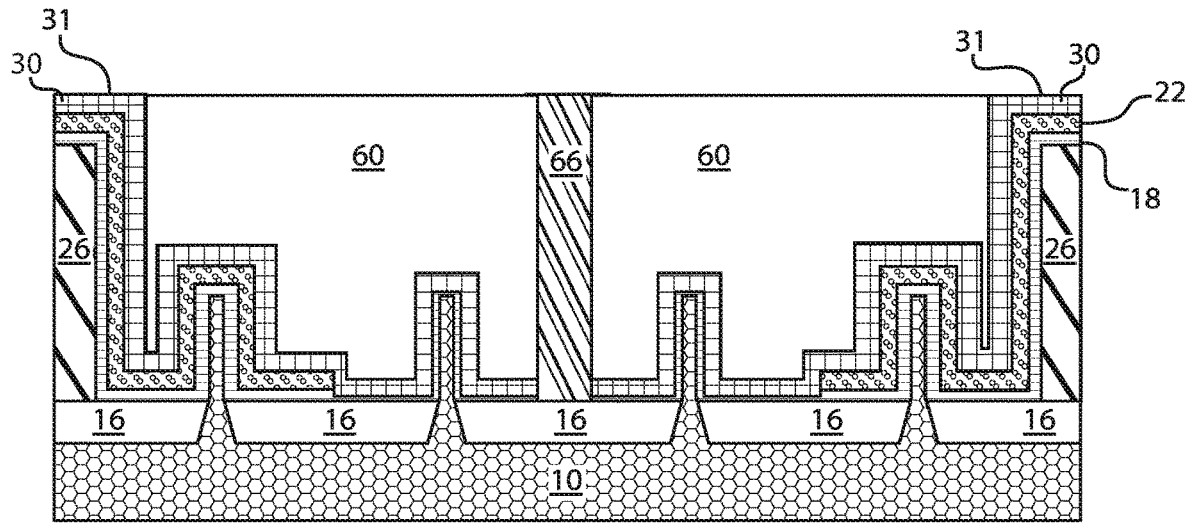
FIG. 15 is a cross-sectional view of the semiconductor structure of FIG. 14 where the gate cut is filled with a dielectric material and planarized back to expose the OPL, in accordance with an embodiment of the present invention.

FIG. 15 is a cross-sectional view of the semiconductor structure of FIG. 14 where the gate cut is filled with a dielectric material and planarized back to expose the OPL, in accordance with an embodiment of the present invention.

In various exemplary embodiments, the patterning stack 62 is removed and the organic patterning layer 60 is recessed such that top surface 31 of the second work function metal layer 30 is exposed. Additionally, an insulating material 66 is deposited within the gate trench 64, etch back/planarization to expose the OPL surface is then performed, and the OPL is ashed.

The insulating material 66 can be planarized, by, e.g., CMP such that the insulating material 66 is flush with the top surface 31 of the second work function metal layer 30.

Figure 16:
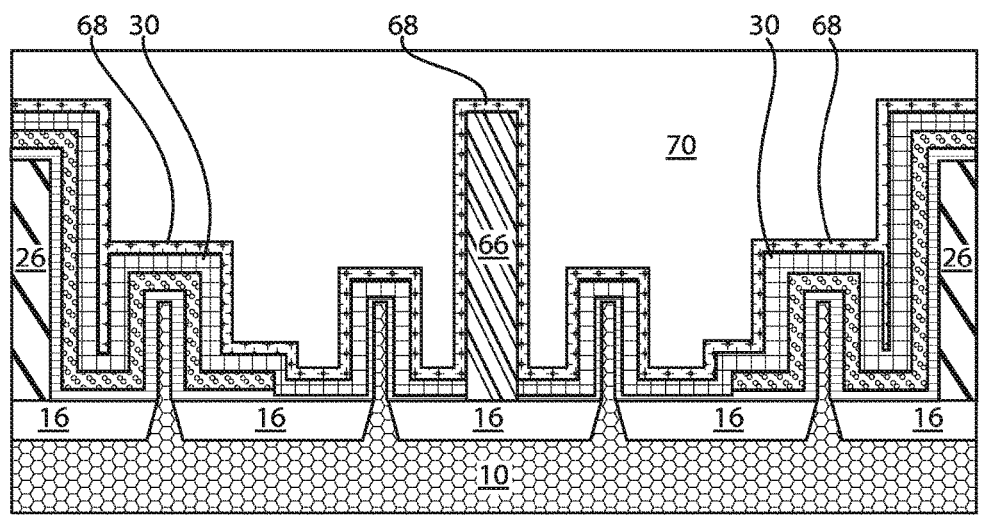
FIG. 16 is a cross-sectional view of the semiconductor structure of FIG. 15 where the OPL is etched (ashed) and a conductive adhesion liner is deposited followed by a metal fill, in accordance with an embodiment of the present invention.

FIG. 16 is a cross-sectional view of the semiconductor structure of FIG. 15 where the OPL is etched and a conductive adhesion liner is deposited followed by a metal fill, in accordance with an embodiment of the present invention.

In various exemplary embodiments, the organic patterning layer 60 is completely removed to expose the second work function metal layer 30. A conductive adhesion liner 68 is then deposited over the second work function metal layer 30. The conductive adhesion liner 68 extends over the insulating material 66 and the fins 12. The conductive adhesion liner 68 directly contacts the sidewalls and top surface of the insulating material 66. A metal fill 70 then takes place. It is noted that an adhesion layer can be employed in all embodiments described herein, as it is needed for any bulk metal deposition.

The conductive adhesion liner 68 can be, e.g., a titanium nitride (TiN) adhesion liner.

Figure 17:
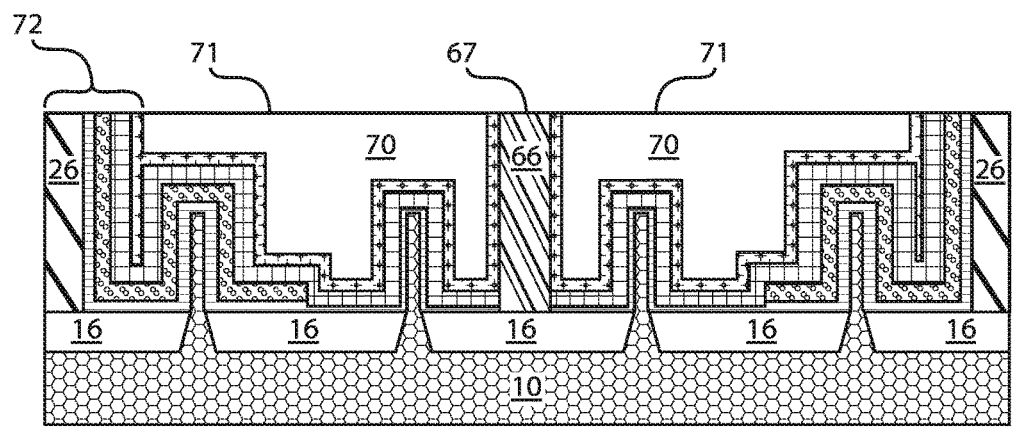
FIG. 17 is a cross-sectional view of the semiconductor structure of FIG. 16 where the gate is planarized, in accordance with an embodiment of the present invention.

FIG. 17 is a cross-sectional view of the semiconductor structure of FIG. 16 where the gate is planarized, in accordance with an embodiment of the present invention.

In various exemplary embodiments, the metal fill 70 is planarized such that top surfaces 72 of the first work function metal layer 22 and the second work function metal layer 30 are exposed. The top surface 67 of the insulating material 66 is also exposed and is flush with the top surface 71 of the planarized metal fill 70.

Therefore, with respect to FIGS. 13-17, a WFM etch on thin WFM side after thin WFM deposition takes place by employing a liner etch (where the insulating material 66 is formed). The thicker WFM metal stack side was cut in the dummy gate silicon (left and right sides of the structure where the insulating CT pillars 26 are formed from etching the dummy polysilicon gate in modules prior to RMG).

Figure 18:
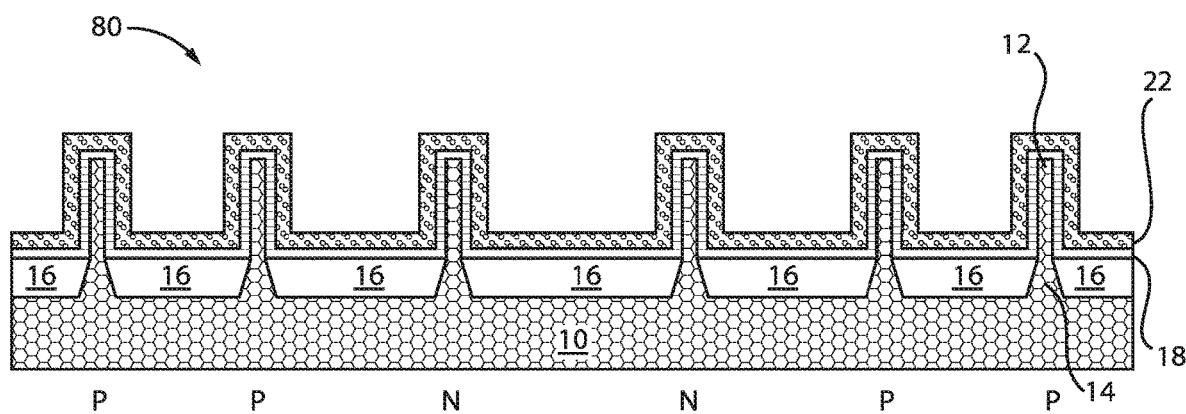
FIG. 18 is a cross-sectional view of a semiconductor structure where a first work function metal layer is deposited over the structure depicting no gate cut fill pillars prior to RMG, in accordance with another embodiment of the present invention.

FIG. 18 is a cross-sectional view of a semiconductor structure where a first work function metal layer is deposited over the structure depicting no gate cut fill pillars prior to RMG, in accordance with another embodiment of the present invention.

In various exemplary embodiments, a semiconductor structure 80 includes a plurality of fins 12 formed over a substrate 10. The fins 12 can define tapered bottom portions 14. Shallow trench isolation (STI) regions 16 can be formed adjacent the tapered bottom portions 14. A high-k dielectric layer 18 can be formed over the fins 12. A first work function metal layer 22 can be formed directly over the high-k oxide layer 18.

In the embodiment illustrated with respect to FIGS. 18-23, the CT is cut once. In particular, a single CT cut is performed in RMG after WFM patterning and bulk metal fill and CMP for a shared gate and an isolated gate. The CT cut is performed after dual WFM patterning and deposition of the second WFM so that dual WFM patterning can facilitate the CT cut. In other words, a single cut in the RMG can be performed on thin WFM (e.g., pFET) after nFET WFM patterning.

Figure 19:
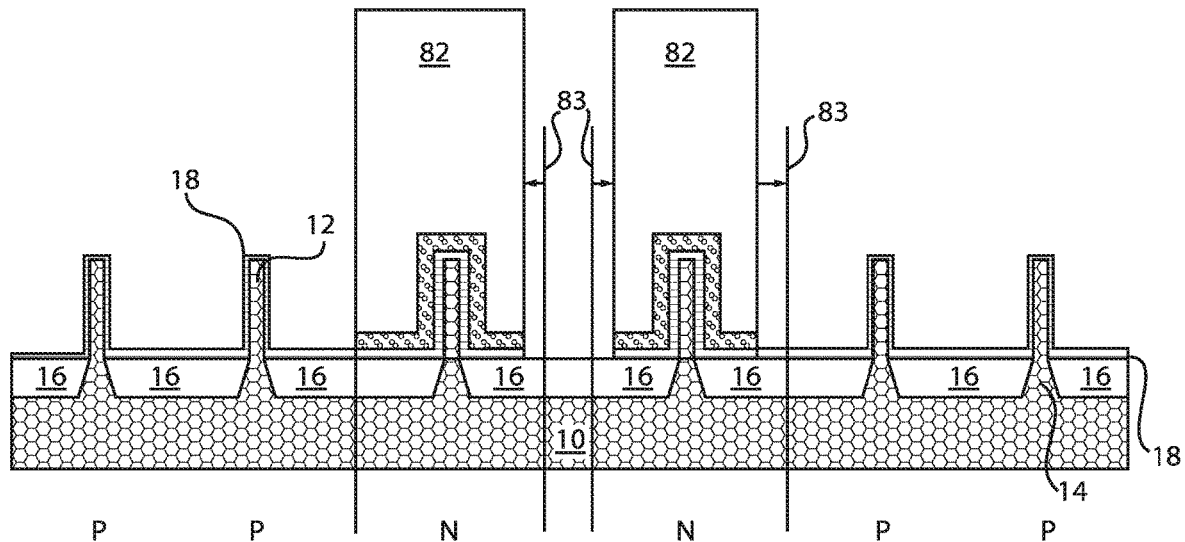
FIG. 19 is a cross-sectional view of the semiconductor structure of FIG. 18 where an organic patterning layer is deposited and patterned to allow removal of the first work function metal layer from a portion of the fins, in accordance with an embodiment of the present invention.

FIG. 19 is a cross-sectional view of the semiconductor structure of FIG. 18 where an organic patterning layer is deposited and patterned to allow for removal of the first work function metal layer from a portion of the fins, in accordance with an embodiment of the present invention.

In various exemplary embodiments, an organic patterning layer 82 is deposited over a portion of the structure 80. In particular, the organic patterning layer 82 is formed over a portion of the fins 12. After the organic patterning layer 82 is deposited, the exposed portions of the first work function metal layer 22 are removed to expose the high-k dielectric layer 18 of the exposed fins 12. Element 83 illustrates the bias needed for the CT cut. This is a similar incoming structure to the first embodiment (e.g., FIG. 3) after block mask patterning and OPL etching. A patterning stack of ARC (anti-reflective coating) and photoresist is deposited and exposed using a block mask. The mask pattern is then etched into the OPL to expose regions where the WFM will be etched.

Figure 20:
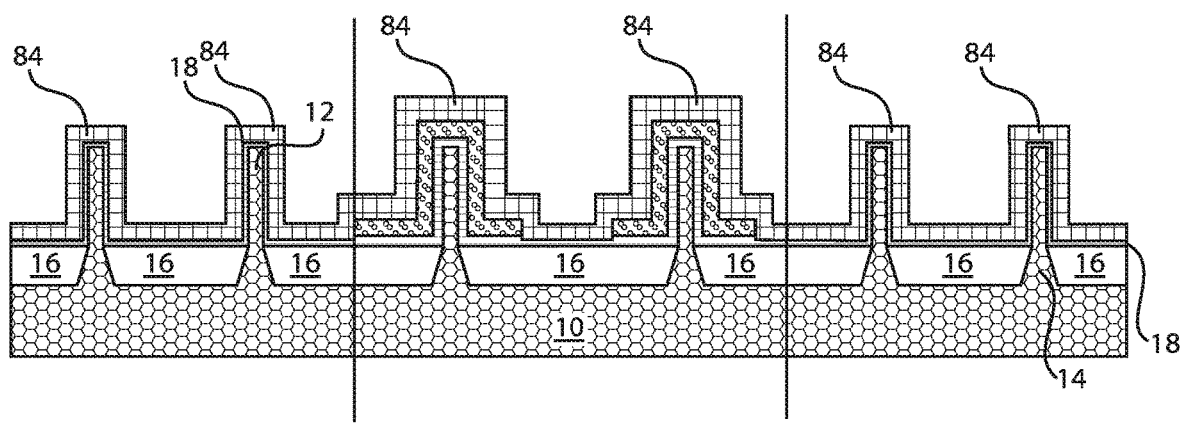
FIG. 20 is a cross-sectional view of the semiconductor structure of FIG. 19 where a second work function metal layer is deposited, in accordance with an embodiment of the present invention.

FIG. 20 is a cross-sectional view of the semiconductor structure of FIG. 19 where a second work function metal layer is deposited, in accordance with an embodiment of the present invention.

In various exemplary embodiments, the OPL 82 is etched away and a second work function metal layer 84 is deposited.

Figure 21:
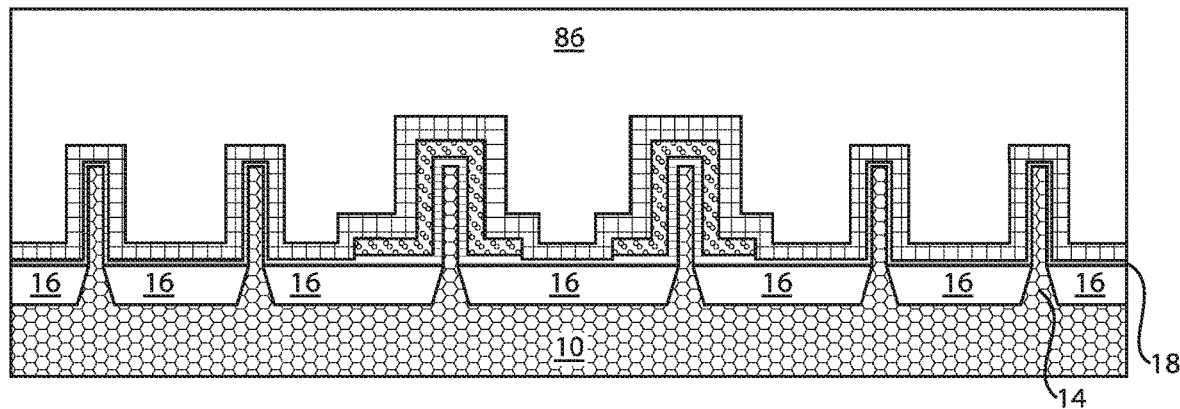
FIG. 21 is a cross-sectional view of the semiconductor structure of FIG. 20 where a metal fill takes place, in accordance with an embodiment of the present invention.

FIG. 21 is a cross-sectional view of the semiconductor structure of FIG. 20 where a metal fill takes place, in accordance with an embodiment of the present invention.

In various exemplary embodiments, a metal fill 86 takes place. The metal fill 86 can be referred to as a conducting material. The metal fill 86 can be any suitable conducting material.

Figure 22:
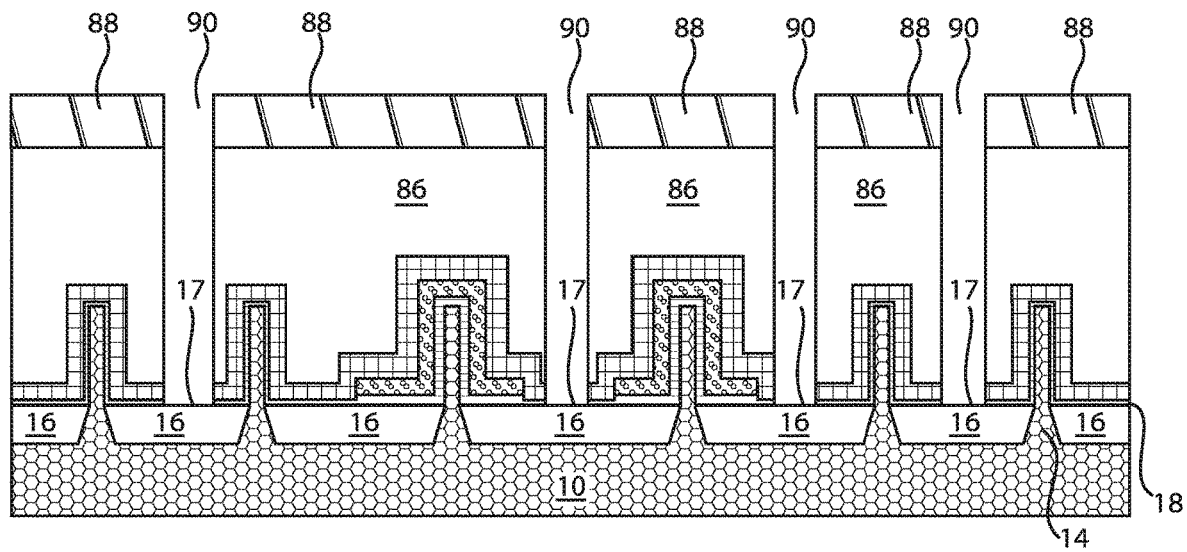
FIG. 22 is a cross-sectional view of the semiconductor structure of FIG. 21 where a patterning stack is deposited and etched, and multiple gate cuts take place in the region with the thinner WFM, in accordance with an embodiment of the present invention.

FIG. 22 is a cross-sectional view of the semiconductor structure of FIG. 21 where a patterning stack is deposited and etched, and multiple gate cuts take place, and the region with the thinner WFM is etched, in accordance with an embodiment of the present invention.

In various exemplary embodiments, a patterning stack 88 is deposited over the metal fill 86. A gate cut is then performed. The gate cut results in the formation of a plurality of gate trenches 90. The gate trenches 90 extend to a top surface 17 of the STI region 16. The gate is cut and the etch is performed in the region with the thinner WFM. The thicker WFM region was cut in prior modules before RMG.

Figure 23:
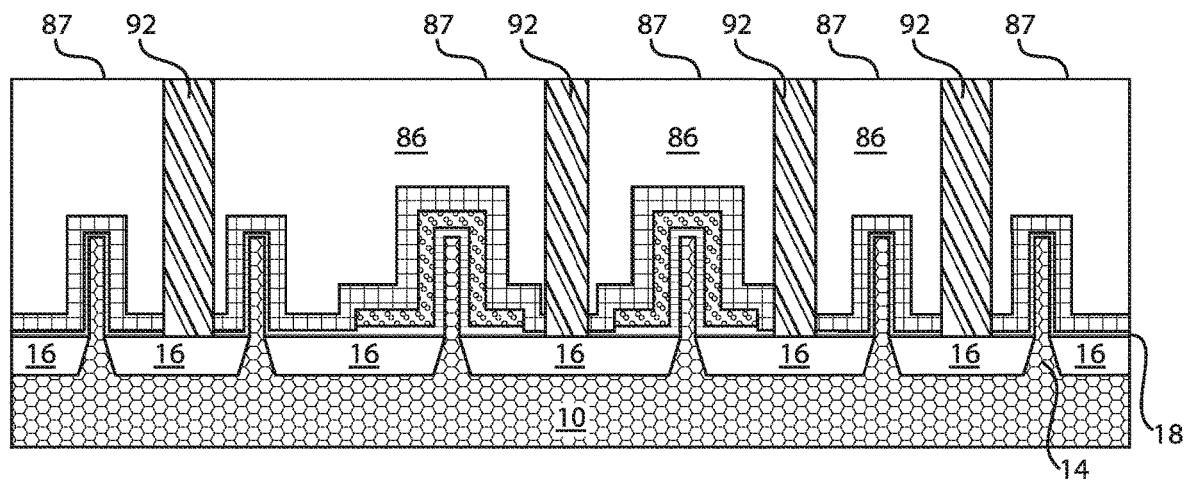
FIG. 23 is a cross-sectional view of the semiconductor structure of FIG. 22 where the gate cuts are filled with a dielectric material, in accordance with an embodiment of the present invention.

FIG. 23 is a cross-sectional view of the semiconductor structure of FIG. 22 where the gate cuts are filled with a dielectric material, in accordance with an embodiment of the present invention.

In various exemplary embodiments, the patterning stack 88 is removed and the metal fill 86 is planarized. Additionally, an insulating material 92 is deposited within the gate trench 90, etch back/planarization to expose the OPL surface is then performed, and the OPL is ashed. The insulating material 92 can be planarized, by, e.g., chemical mechanical planarization (CMP) such that the insulating material 92 is flush with the top surface 87 of the planarized metal fill 86. An anisotropic OPL etch and WFM etch is performed. This WFM etch can be isotropic (wet) or anisotropic (dry).

Therefore, with respect to FIGS. 18-23, a direct anisotropic tungsten (W) etch and a WFM etch on thin WFM side at post gate WCMP takes place (where the insulating material 92 is formed). The thicker WFM metal stack side was cut during WFM patterning.

Moreover, specific locations of the devices can be cut at different points in the dummy gate silicon and RMG steps. The specific locations can be P-P boundaries and N-P boundaries. In particular, the P-P boundary in the RMG is due to thin WFM and the N-N boundary in the dummy gate silicon is due to the thick WFM. Regarding the N-P boundary, in the RMG post pFET patterning and the nFET WFM etch and the pFET WFM deposition, and only cut thin WFM region at the boundary.

Figure 24:
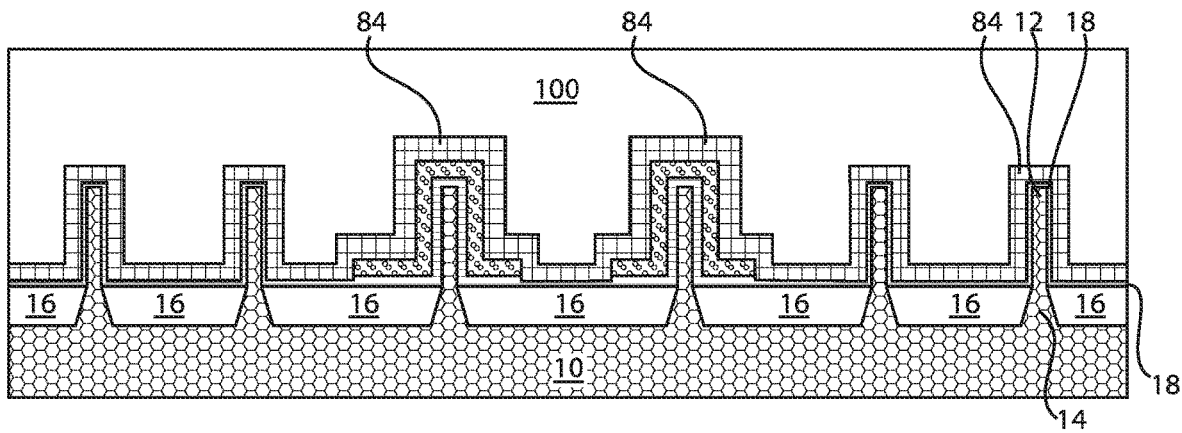
FIG. 24 is a cross-sectional view of a semiconductor structure where an organic patterning layer is deposited over a second work function metal layer (instead of metal deposition), in accordance with another embodiment of the present invention.

FIG. 24 is a cross-sectional view of a semiconductor structure where an organic patterning layer is deposited over a second work function metal layer (instead of metal deposition), in accordance with another embodiment of the present invention.

In various exemplary embodiments, an organic patterning layer 100 is formed over the second work function metal layer 84.

In the embodiment illustrated with respect to FIGS. 24-29, the CT is cut once. In particular, a single CT cut is performed in RMG after WFM patterning and bulk metal fill and CMP for a shared gate and an isolated gate. The CT cut is performed after dual WFM patterning and deposition of the second WFM so that dual WFM patterning can facilitate the CT cut. In other words, a single cut in the RMG can be performed on thin WFM (e.g., pFET) after nFET WFM patterning.

Figure 25:
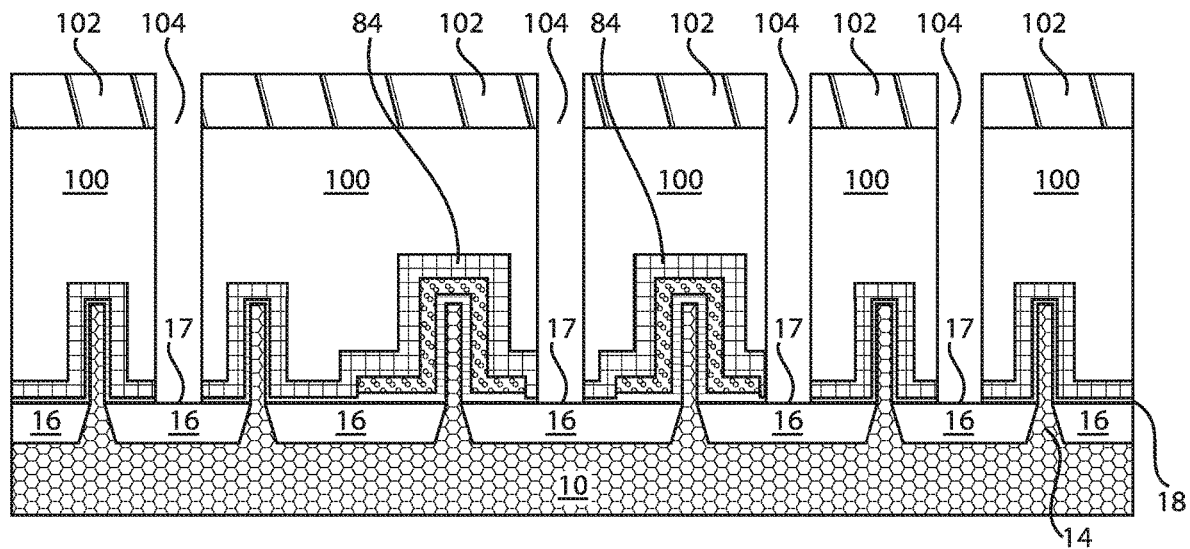
FIG. 25 is a cross-sectional view of the semiconductor structure of FIG. 24 where a patterning stack is deposited and etched, and multiple gate cuts take place in the region with the thinner WFM, in accordance with an embodiment of the present invention.

FIG. 25 is a cross-sectional view of the semiconductor structure of FIG. 24 where a patterning stack is deposited and etched, and multiple gate cuts take place in the region with the thinner WFM, in accordance with an embodiment of the present invention.

In various exemplary embodiments, a patterning stack 102 is deposited over the organic patterning layer 100. A patterning stack of ARC (anti-reflective coating) and photoresist is deposited and exposed using a block mask. The mask pattern is then etched into the OPL to expose regions where the WFM will be etched. The gate cut results in the formation of a gate trench 104. The gate trench 104 extends to a top surface 17 of the STI region 16. The gate cut also removes a portion of the second work function metal layer 84. The gate is cut and the etch is performed in the region with the thinner WFM. The thicker WFM region was cut in prior modules before RMG.

Figure 26:
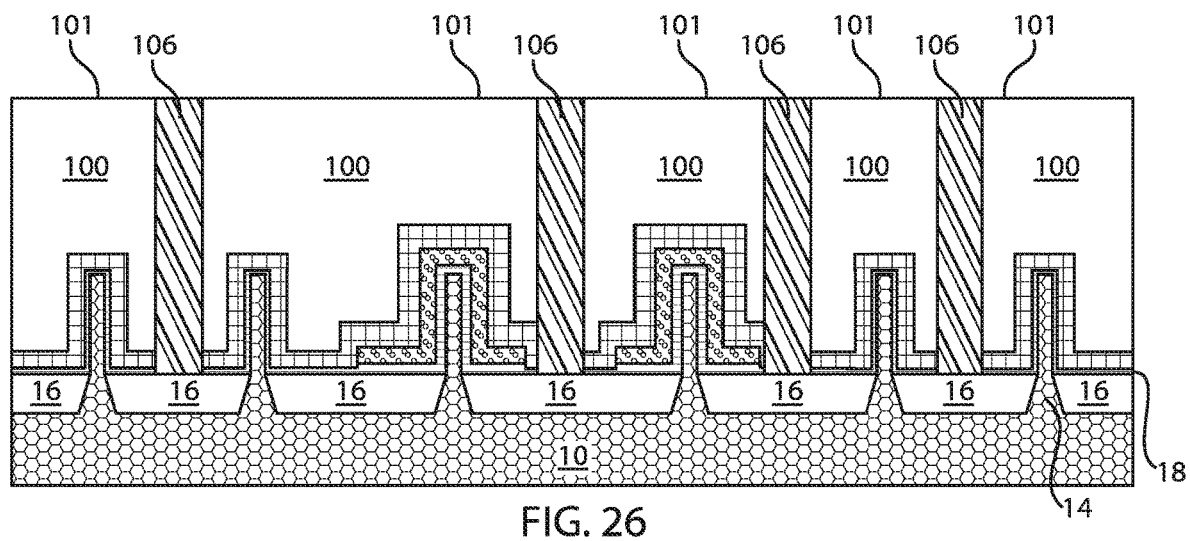
FIG. 26 is a cross-sectional view of the semiconductor structure of FIG. 25 where the gate cuts are filled with a dielectric material and planarized to expose the top surface of the OPL, in accordance with an embodiment of the present invention.

FIG. 26 is a cross-sectional view of the semiconductor structure of FIG. 25 where the gate cuts are filled with a dielectric material and planarized to expose the top surface of the OPL, in accordance with an embodiment of the present invention.

In various exemplary embodiments, the patterning stack 102 is removed and the organic patterning layer 100 is recessed. Additionally, metal etching takes place, followed by an insulator fill with insulating material 106 into the plurality of trenches 104, then CMP back to the top of the metal. The insulating material 106 can be planarized, by, e.g., CMP such that the insulating material 106 is flush with the top surface 101 of the organic patterning layer 100.

Figure 27:
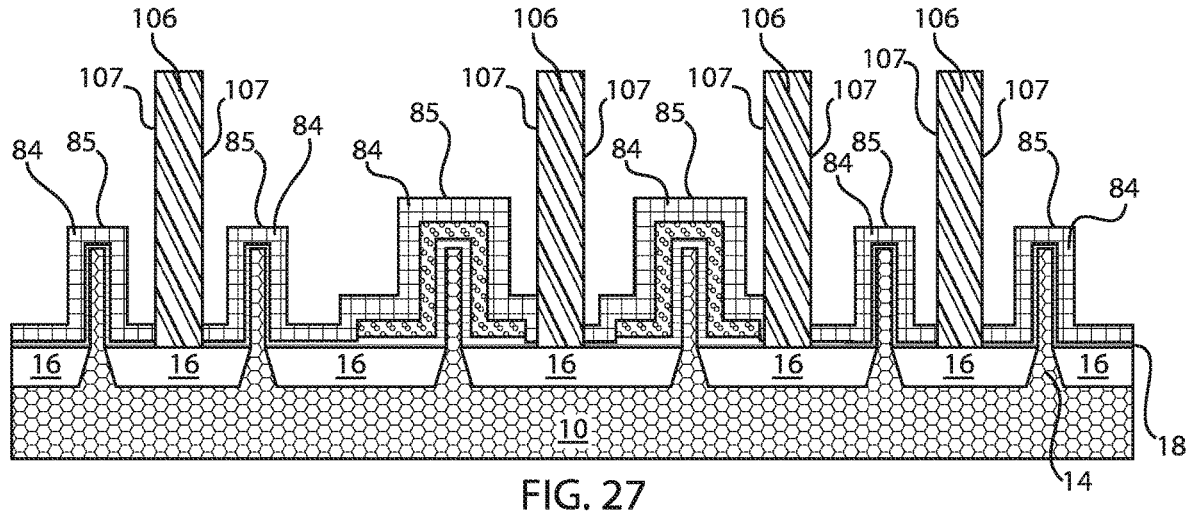
FIG. 27 is a cross-sectional view of the semiconductor structure of FIG. 26 where the organic patterning layer is removed, in accordance with an embodiment of the present invention.

FIG. 27 is a cross-sectional view of the semiconductor structure of FIG. 26 where the organic patterning layer is removed, in accordance with an embodiment of the present invention.

In various exemplary embodiments, the organic patterning layer 100 is completely removed to exposed a top surface 85 of the second work function metal layer 84.

Figure 28:
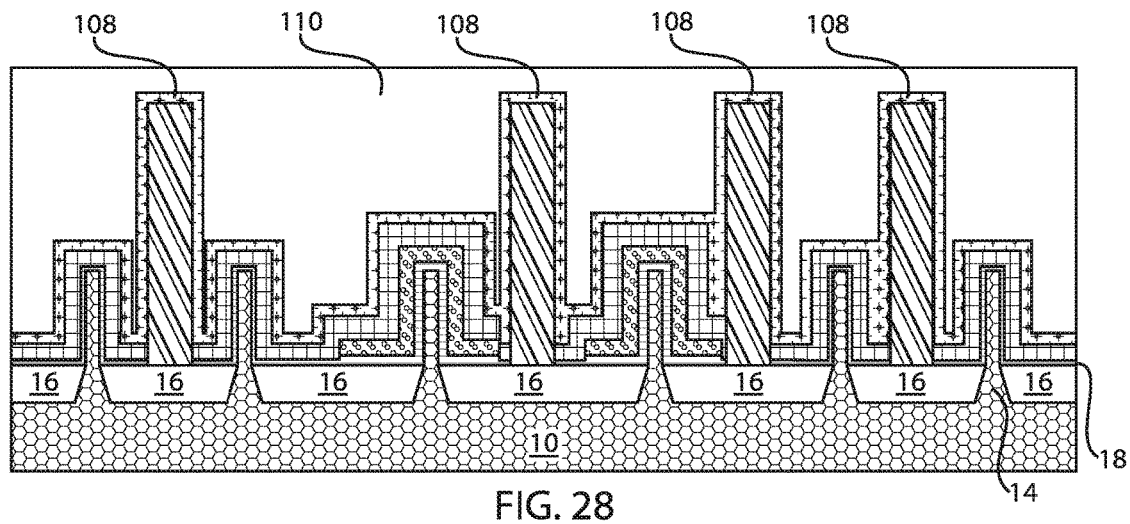
FIG. 28 is a cross-sectional view of the semiconductor structure of FIG. 27 where a conductive adhesion liner is deposited followed by a metal fill, in accordance with an embodiment of the present invention.

FIG. 28 is a cross-sectional view of the semiconductor structure of FIG. 27 where a conductive adhesion liner is deposited followed by a metal fill, in accordance with an embodiment of the present invention.

A conductive adhesion liner 108 is then deposited over the second work function metal layer 84. The conductive adhesion liner 108 extends over the insulating material 106 and the fins 12. The conductive adhesion liner 108 directly contacts the sidewalls and top surface of the insulating material 106. A metal fill 110 then takes place. The conductive adhesion liner 108 can be, e.g., a titanium nitride (TiN) adhesion liner.

Figure 29:
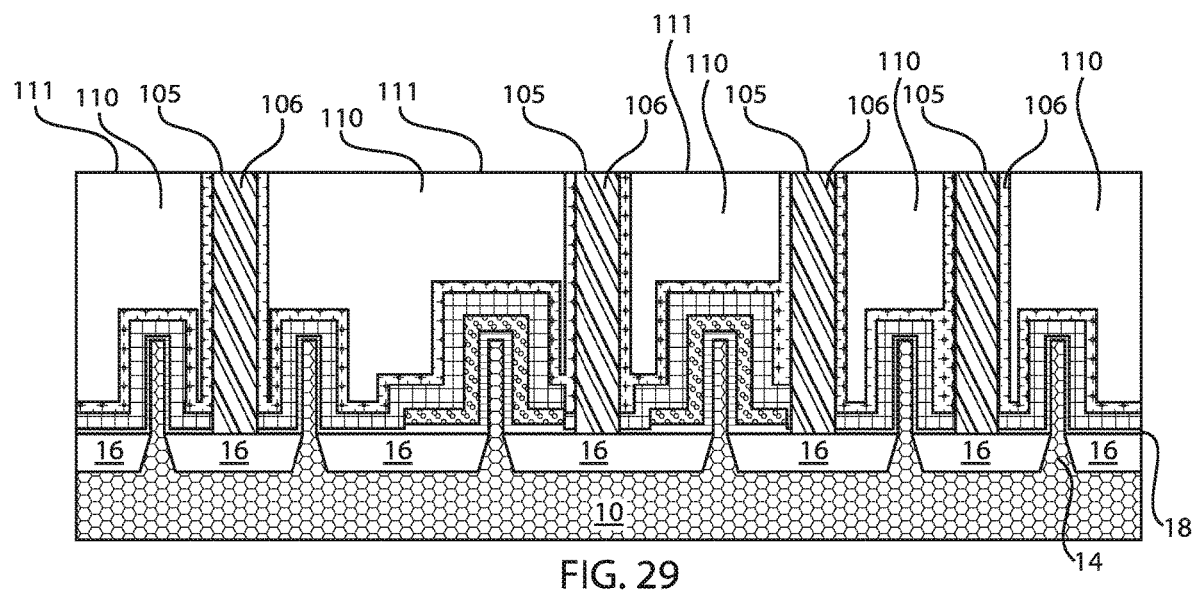
FIG. 29 is a cross-sectional view of the semiconductor structure of FIG. 28 where the gate is planarized, in accordance with an embodiment of the present invention.

FIG. 29 is a cross-sectional view of the semiconductor structure of FIG. 28 where the gate is planarized, in accordance with an embodiment of the present invention In various exemplary embodiments, the metal fill 110 is planarized such that top surfaces of the first work function metal layer 22 and the second work function metal layer 84 are exposed. The top surface 105 of the insulating material 106 is also exposed and is flush with the top surface 111 of the planarized metal fill 110.

Therefore, with respect to FIGS. 24-29, a WFM etch on thin WFM side after thin WFM deposition takes place by employing a liner etch (where the insulating material 106 is formed). The thicker WFM metal stack side was cut during WFM patterning.

In conclusion, the exemplary embodiments of the present invention focus on cutting the thin WFM layers in RMG by employing either WFM liner or bulk etching, or employing WFM patterning to remove the thicker WFM stack prior to cutting the thin WFM. In some exemplary embodiments of the present invention, a gate cut occurs both in the dummy gate silicon and in the RMG. In the alternative, a single gate cut can occur only in the RMG where the thinner WFM is etched after the thicker WFM patterning. As a result, gate cuts occur at least in the RMG or RMG module. Stated differently, the exemplary embodiments of the present invention include a gate cut process that focuses on only cutting the gate region with the thin WFM liner in RMG, where this region would have the least lateral undercut and potential to cause electrical variation/impact to the structure. The exemplary process is different from conventional approaches because of (1) cut regions where thick WFM resides in the dummy gate silicon (prior to RMG module, after the dummy gates are formed) and cut thin WFM in RMG or (2) when the thin WFM in RMG is cut after the thicker WFM layer is already patterned.

Furthermore, the exemplary embodiments of the present invention introduce methods for performing gate cuts in FET device structures fabricated by the RMG process flow which include:

1) cutting the thick work function metal region (WFM for nFET) in the dummy gate silicon step and the thin WFM region in the RMG step (two cuts), and 2) single cut in RMG stage performed on thin WFM (pFET) after nFET WFM patterning and $2^{nd}$ WFM deposition so that dual WFM patterning can facilitate the CT wherein cutting can be by direct WFM etch or W contact etch plus WFM etch (if cut after metal fill). Also, specific locations of the devices (P-P and N-P boundaries, shared gates versus isolated gates) can be cut at different points in the dummy gate silicon and RMG steps.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for performing gate cuts in field effect transistor (FET) device structures during replacement metal gate (RMG) processes, (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for performing a gate cut in a field effect transistor (FET) structure, the method comprising:
    forming a plurality of fins and at least one insulating pillar over a semiconductor substrate;
    depositing a first work function metal layer extending over the plurality of fins and extending over the at least one insulating pillar;
    removing the first work function metal layer from a first set of fins;
    depositing a second work function metal layer;
    depositing a conductive material over the second work function metal layer;
    forming at least one gate trench through the conductive material and adjacent the first set of fins to separate active gate regions;
    filling the at least one gate trench with an insulating material; and
    planarizing the insulating material such that the at least one insulating pillar has a same height as the first work function metal layer,
    wherein portions of the second work function metal layer are collinear with portions of the first work function metal layer after formation of the at least one gate trench.

2. The method of claim 1, further comprising forming a dielectric layer over the plurality of fins and over the at least one insulating pillar before depositing the first work function metal layer.

3. The method of claim 2, further comprising depositing a patterning stack over the conductive material and before forming the at least one gate trench.

4. The method of claim 1, further comprising employing work function metal patterning to remove the first work function metal layer prior to forming the at least one gate trench.

5. The method of claim 1, wherein the conductive material is tungsten (W) and the insulating material is a nitride-based insulator.

6. The method of claim 1, wherein the at least one insulating pillar is a silicon nitride (SiN) gate cut fill pillar.

7. A method for performing a single gate cut after dual work function metal patterning, the method comprising:
   forming a plurality of fins and at least one insulating pillar over a semiconductor substrate;
   depositing a first work function metal layer extending over the plurality of fins and extending over the at least one insulating pillar;
   removing the first work function metal layer from a first set of fins;
   depositing a second work function metal layer;
   depositing a conductive material over the second work function metal layer;
   forming at least one gate trench through the conductive material and through the second work function metal layer;
   filling the at least one gate trench with an insulating material; and
   planarizing the insulating material such that the at least one insulating pillar has a same height as the first work function metal layer,
   wherein portions of the second work function metal layer are collinear with portions of the first work function metal layer after formation of the at least one gate trench.

8. The method of claim 7, further comprising forming a dielectric layer over the plurality of fins before depositing the first work function metal layer.

9. The method of claim 8, further comprising depositing a patterning stack over the conductive material and before forming the at least one gate trench.

10. The method of claim 7, wherein the conductive material is tungsten (W) and the insulating material is a nitride-based insulator.

11. The method of claim 7, further comprising depositing a conductive adhesion liner before depositing the conductive material.

12. The method of claim 11, wherein the conductive adhesion liner is a titanium nitride (TiN) adhesion liner.

* * * * *